(12) United States Patent
Phillips (10) Patent No.: US 8,002,420 B2
(45) Date of Patent: Aug. 23, 2011

(54) HYDROSTATIC LIQUID-METAL DEFORMABLE OPTICAL ELEMENTS

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 526 days.

(21) Appl. No.: 12/209,094

(22) Filed: Sep. 11, 2008

(65) Prior Publication Data

US 2010/0020423 A1      Jan. 28, 2010

Related U.S. Application Data

(60) Provisional application No. 61/082,962, filed on Jul. 23, 2008.

(51) Int. Cl.
*G02B 5/08* (2006.01)

(52) U.S. Cl. ............................................ 359/846
(58) Field of Classification Search .......... 359/845, 359/846
See application file for complete search history.

(56) References Cited

U.S. PATENT DOCUMENTS

| | | | |
|---|---|---|---|
| 4,003,640 A | 1/1977 | Hansen | |
| 4,190,327 A | 2/1980 | Hughes | |
| 6,764,187 B2 * | 7/2004 | Ryutov et al. | 359/846 |
| 6,880,942 B2 | 4/2005 | Hazelton et al. | |
| 6,989,922 B2 | 1/2006 | Phillips et al. | |
| 2003/0234993 A1 | 12/2003 | Hazelton et al. | |
| 2006/0176460 A1 | 8/2006 | Phillips et al. | |
| 2006/0181689 A1 | 8/2006 | Phillips et al. | |
| 2007/0211352 A1 | 9/2007 | Phillips et al. | |

OTHER PUBLICATIONS

U.S. Appl. No. 11/983,615, filed Nov. 9, 2007, Watson et al.
The textbook of Yoder, "Opto-Mechanical Systems Design," Third Edition, pp. 527-553 (applicable sections).
Brauer et al., "Liquid-Metal-Cooled, Curved-Crystal Monochromator for Advanced Photon Source Bending-Magnet Beamline 1-BM*," SRI '95 APS X-ray Centennial Symposium/Seventh Users Meeting for the APS, Oct. 16-20, 1995.
Frisch et al, "Advanced Collimator Engineering for the NLC*," Proceedings of the 2001 Particle Accelerator Conference, Chicago, 2001.
Smither et al., "Liquid Gallium Cooling of Silicon Crystals in High Intensity Photon Beams (invited)", Rev. Sci. Instrum. 60(7), Jul. 1989.
U.S. Appl. No. 12/261,798, filed Oct. 30, 2008, Phillips.

* cited by examiner

*Primary Examiner* — Euncha P Cherry
(74) *Attorney, Agent, or Firm* — Klarquist Sparkman, LLP (57) ABSTRACT

Optical components and systems are disclosed that include an optical element and a base member. Multiple wells correspond to respective locations on a surface of the optical element. Liquid metal in the wells is coupled to the respective locations to apply respective hydrostatic pressures to the locations. At least one displacement device is coupled to at least one well to selectively change the respective hydrostatic pressure applied, relative to the base member, by the liquid metal in the well to the respective location. The "liquid metal" is any of several formulations of metal that are liquid under actual-use conditions (e.g., a liquid alloy of gallium). The liquid metal can be displaced through conduits to change the hydrostatic pressure being applied to the respective locations. The displacement, and hence the hydrostatic pressure, can be feedback controlled.

67 Claims, 7 Drawing Sheets

HYDROSTATIC LIQUID-METAL DEFORMABLE OPTICAL ELEMENTS

CROSS-REFERENCE TO RELATED APPLICATION

This application claims priority from, and the benefit of, U.S. Provisional Application No. 61/082,962, filed on Jul. 23, 2008, which is incorporated herein by reference in its entirety.

FIELD

This disclosure pertains to, inter alia, active optics as used in various types of optical systems, such as, but not limited to, optical systems used in microlithography systems.

BACKGROUND

Imaging-optical systems as used in various applications have been the subject of substantial research and development activity directed at improving the resolving power and other optical-performance aspects of the systems. One approach to improving optical performance is simply to manufacture the system's optical elements to tighter tolerances. This approach also typically includes manufacturing and assembling the mechanical components of the system (e.g., mountings, spacers, frames, columns, and barrels) to tighter tolerances. Another approach is to control more strictly (and hence reduce variations in) the operating environment of the optical system by, e.g., controlling atmosphere, pressure, temperature, vibrations, and other parameters. These approaches have been adopted, usually in combination, with varying degrees of success, depending upon the application of the optical system. But, in certain applications, applying these approaches still does not produce satisfactory levels of optical performance from the system.

One application in which the results of applying these ameliorative approaches have been increasingly insufficient is microlithography, which is used for imprinting patterns for microcircuits, display elements, and the like on lithographic substrates (e.g., semiconductor wafers or display panels). Most microlithography now being performed utilizes deep ultraviolet (DUV) light ($\lambda \gtrsim \sim 150$ nm) for making exposures, and the currently emerging lithographic technology utilizes extreme ultraviolet (EUV) light ($\lambda=11$-$14$ nm). DUV lithography is performed using imaging optical systems that are either catadioptric (combination of refractive and reflective) or all refractive. EUV lithography is performed using imaging optical systems that are catoptric (all reflective) because no practical materials are known for making EUV lenses.

In DUV and EUV microlithography systems, and in certain other imaging-optical systems (such as astronomical telescopes), attention has been given to changing the shape of an optical element (particularly the optical surface of a reflective optical element) slightly and in a controlled manner to improve its imaging performance. Optical elements having this capability are termed "active" optics or "adaptive" optics. "Active" optics pertains to improving optical performance as otherwise affected by static factors (e.g., manufacturing tolerances) or slowly or intermittently changing factors. Example factors include: (1) change in the topology of an optical surface of an optical element due to different gravitational forces acting on the optical element (especially if the position of the optical element is changed during use); (2) change in the operating environment (e.g., temperature) of the optical element during use, causing corresponding changes in the topology of the reflective surface; (3) the optical surface having a non-ideal shape due to stack-up of manufacturing tolerances; and/or (4) the subject optical element is located upstream or downstream of other optical element(s) having their own uncorrected errors. "Adaptive" optics generally operate on a much shorter time scale than active optics to compensate for rapidly changing factors such as atmospheric effects or vibrations. For example, adaptive optics are used in certain astronomical telescopes to improve astronomical "seeing" conditions in substantially real time.

An active optical system has at least one optical element of which the geometry of an optical surface can be changed from time to time as required, at least within a defined range. The optical surface is changed by operation of passive or active actuators that deform respective regions of the optical surface as required to achieve or maintain an optimal shape of the surface. The amount of this change is normally extremely small.

Passive actuators have been used in astronomical telescopes in which the active optical system is a large mirror that is movable with respect to the earth's gravity. The actuators control and change the distribution of forces acting on the mirror to minimize distortions of the optical surface caused by a change in the direction of gravity acting on the mirror. An exemplary passive actuator for such use is a levered counterweight used in a "flotation" mounting for the mirror. The levered counterweight applies a correcting force that automatically varies in magnitude (and possibly also in direction) depending upon the direction in which gravity is acting on the counterweight. The levered counterweight can be configured to apply force to the mirror axially and/or radially. See Yoder, *Opto-Mechanical Systems Design,* 3rd Edition, SPIE Press, Bellingham Wash., 2006; pages 527-533. The mirror may have passive actuators only, a combination of passive and active actuators, or active actuators only. Conventional active actuators are hydraulic or pneumatic actuators. Id., pages 534-553.

SUMMARY

Various aspects of the invention disclosed herein provide, inter alia, optical elements having optical surfaces that are deformable in a controlled manner by hydrostatic pressure. An embodiment of an optical component comprises an optical element having a surface. The optical component also includes a base member and multiple wells corresponding to respective locations on the surface. Liquid metal is contained in the wells and coupled to the respective locations to apply respective hydrostatic pressures to the respective locations. At least one displacement device is coupled to at least one well. The displacement device selectively changes the respective hydrostatic pressure applied, relative to the base member, by the liquid metal in the well to the respective location. The "liquid metal" is any of several formulations of metal that are liquid under actual-use conditions. Many formulations are liquid alloys of gallium, for example. The liquid metal can be displaced through conduits to change the hydrostatic pressure being applied to the respective locations.

In many embodiments the optical element is a mirror or other reflective optical element having an obverse surface and a reverse surface, wherein the "surface" referred to above is the reverse surface, and the obverse surface is the reflective, or optical, surface of the element. The wells in many of these embodiments are located on or near the reverse surface of the optical element, and correspond to respective locations on the reverse surface. The liquid metal in the wells can be coupled to the respective locations by actual contact of the liquid metal in the wells to the respective locations.

Certain embodiments include a base member having a surface facing the reverse surface of the optical element. The wells in these embodiments can be situated on the surface of the base member. The wells are hydraulically coupled to respective access wells primed with liquid metal, and respective heights of liquid metal in the access wells produce respective hydrostatic pressures of liquid metal in the wells at the respective locations on the reverse surface. Each well can be hydraulically coupled to its respective access well by a respective restrictor having a smaller transverse dimension than the corresponding well or access well. At least some of the access wells include means for adding or removing liquid metal from the access wells to change the respective hydrostatic pressures.

The liquid metal in the wells can be in direct contact with the respective locations, or can be in contact with posts coupled to the respective locations, such that hydrostatic pressure of the liquid metal is applied directly to the respective locations or applied to the posts, respectively, or some combination of these.

In certain embodiments having movable posts, each well includes a respective volume of liquid metal, and a respective movable post extends into the respective volume. In these embodiments the displacement device comprises at least one movable-post actuator, wherein movement of a post by the actuator changes the respective hydrostatic pressure applied by the liquid metal in the respective well to the respective location. The actuator can serve one or multiple posts.

In certain embodiments the respective hydrostatic pressures in the wells are applied to respective fixed posts mounted to the respective locations on the reverse surface of the optical element and extending into the liquid metal in the respective wells. Changes in hydrostatic pressure in a well correspondingly change a buoyant force applied by the liquid metal in the well to the respective fixed post. An example configuration includes a base member having a first surface facing the reverse surface of the optical element and a second surface opposite the first surface. The actuators are situated on the second surface, and the movable posts extend from the actuators through the base member to the wells. The wells can be situated on the first surface of the base member or on the reverse surface of the optical element, for example.

In certain embodiments the wells are defined in the reverse surface of the optical element. Movable posts extend into the liquid metal in the respective wells. The displacement device comprises respective actuators coupled to the movable posts, wherein the actuators are selectively actuatable to move the respective movable posts in the respective wells to produce respective hydrostatic pressures applied by the liquid metal to the respective locations.

In other embodiments the wells are located on a first surface of the base member facing the reverse surface of the optical element. Respective fixed posts coupled to the reverse surface of the optical element extend into the liquid metal in the respective wells. The wells can also include respective movable posts extending into the liquid metal in the respective wells. Respective actuators of the displacement device can be coupled to the movable posts, wherein the actuators are selectively actuatable to move the respective movable posts in the respective wells to produce respective hydrostatic pressures applied by the liquid metal to the fixed posts.

In embodiments including a base member, the base member can define a coolant conduit that conducts a temperature-controlled coolant fluid used for cooling the optical element. Heat in the optical element is conducted to the base member and thus to the coolant fluid circulating in the base member.

In some embodiments the displacement device comprises respective linear actuators that are coupled to respective movable posts configured as summarized above. These respective linear actuators are selectively actuatable to move the respective movable posts in the respective wells to produce respective hydrostatic pressures applied by the liquid metal to the posts.

In certain embodiments the displacement device comprises a movable transfer stylus configured selectively to hold and to release liquid metal for transport and release, respectively. Liquid metal added or removed from a well by the stylus changes the hydrostatic pressure applied by the liquid metal to the respective location. Addition or removal of liquid metal from wells can involve thermal control of the transfer stylus, wherein the stylus is operable selectively to have a temperature below a freezing temperature of the liquid metal sufficiently to hold frozen liquid metal to the stylus and to have a temperature above a melting temperature of the liquid metal sufficiently to inhibit holding of liquid metal to the stylus.

Various devices can be included to provide feedback control of changes to the surface of the optical element as produced by changes in hydrostatic pressure applied to the surface by the liquid metal. For example, a sensor-light source can be situated relative to the surface of the optical element, with a sensor being situated relative to the source and to the surface of the optical element to receive sensor light, from that source, reflected from the surface. A controller is connected to the sensor and to the displacement device, wherein the controller actuate the at least one actuator, based on data from the sensor, to change hydrostatic pressure at at least one location.

Another aspect of the invention is directed to optical systems. An exemplary optical system comprises a frame, a base member mounted to the frame, and an optical element mounted to the frame and situated relative to the base member, wherein the optical element having an optical surface and a reverse surface. As summarized above, multiple wells correspond to respective locations on the reverse surface, and liquid metal contained in the wells is coupled to the respective locations to apply respective hydrostatic pressures to the respective locations. At least one displacement device is coupled to at least one well and selectively changes the respective hydrostatic pressure applied, relative to the base member, by the liquid metal in the well to the respective location. Desirably, the base member and the optical element are mounted to the frame kinematically.

According to yet another aspect, methods are provided for producing an active-optics change of an optical surface of an optical element. In an exemplary embodiment, multiple discrete contained volumes of liquid metal are provided, and the contained volumes are coupled to respective locations on a reverse surface of the optical element to apply respective hydrostatic forces to the respective locations. The method includes changing the respective hydrostatic force applied by at least one of the contained volumes to the respective location to produce a corresponding change in a region of the optical surface. The method can include monitoring performance of the optical surface, and changing the respective hydrostatic force applied by at least one of the contained volumes in response to the monitored performance to achieve a desired performance.

The foregoing and additional features and advantages of the invention will be more readily apparent from the following detailed description, which proceeds with reference to the accompanying drawings.

DETAILED DESCRIPTION

This disclosure is set forth in the context of multiple representative embodiments that are not intended to be limiting in any way.

In the following description certain words are used, such as "upward," "downward," "vertical," "horizontal," and the like. These words are used to provide clarity of the descriptions when read in the context of the drawings. Whereas these words are useful in understanding relative relationships, they are not intended to be limiting. For example, a device depicted in a drawing readily can be turned upside down, resulting in an "upper" surface becoming a "lower" surface, and vice versa.

First Representative Embodiment

This embodiment, although not as preferred for practical reasons as the second and third embodiments described later below, has features that are readily described and understood from a general perspective.

Figure 1:
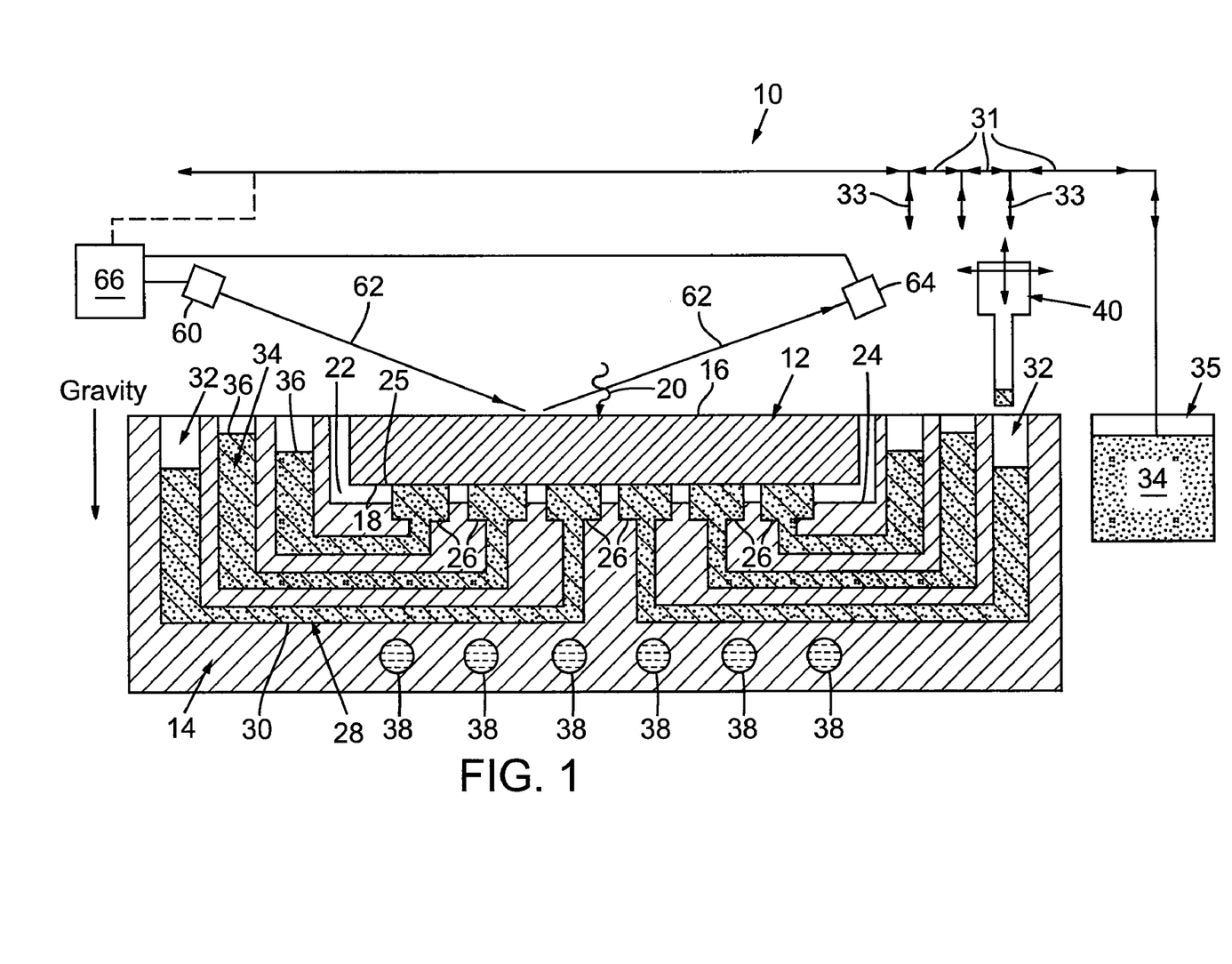
FIG. 1 is a vertical section of a first embodiment.

This embodiment of an active optical element 10 is depicted in FIG. 1, which depicts an optical element 12 and a manifold 14 (also called a "heat exchanger" or "base member"). The optical element 12 in this embodiment is a reflective optical element, generally termed a "mirror." As such, the optical element 12 has a reflective surface 16, as an example "optical surface," and an under-surface 18 (also called a "reverse surface"). The reflective surface 16 receives and reflects incident radiation 20. In this embodiment the optical element 12 is substantially horizontal (note arrow denoting direction of gravitational force), with the reflective surface 16 facing upward.

The manifold 14 defines a recess 22 in which the mirror 12 is situated, with its under-surface 18 facing downward. The recess 22 has a bottom surface 24 from which activation wells 26 extend upward, toward the under-surface 18. Each activation well 26 has a circular, polygonal, or other suitable shape (circular is shown in the figure). The tops of all the activation wells 26 reside in a plane (to conform to a planar under-surface 18) or otherwise collectively conform to the shape of the under-surface if the under-surface is not planar.

Connected to each activation well 26 is a respective conduit 28, including a respective "restrictor conduit" 30 and access well 32. The conduits 28 contain "liquid metal" 34, described below. The diameter or other transverse dimension of the restrictor conduit 30 desirably is less than of the activation well 26, and desirably less than of the access well 32, for reasons discussed below.

As implied by its name, "liquid metal" 34 is a metal that is liquid under actual-use conditions. Mercury is a well-known example, but mercury is disadvantageously toxic, and its vapor pressure is too high for use in most vacuum conditions. More suitable liquid-metal formulations are various gallium alloys, including (but not limited to), gallium-indium eutectic, other liquid gallium-indium alloys, gallium-indium-tin eutectic (e.g., "galistan"), other liquid gallium-indium-tin alloys, liquid gallium-tin alloys, liquid gallium-indium-tin-silver alloys, and liquid gallium-indium-zinc-copper alloys. These gallium-based liquid-metal formulations have very low vapor pressures, can be used in many vacuum environments, and are less toxic than mercury. These liquid-metal formulations also have sufficiently low melting temperatures to be liquid at normal operating temperature (e.g., room temperature) and to remain liquid at least down to a specified minimum temperature (e.g., 10° C. or less). Liquid metal 34 also advantageously has good thermal conductivity for conducting heat from the optical element 12 across the gaps to the activation wells 26 and to the manifold 14.

The conduit 28, including the respective activation well 26, restrictor conduit 30, and an appropriate volume of the access well 32, is primed with liquid metal 34. In each access well 32 the liquid metal 34 has a level 36 that is higher than the top of the respective activation well 26 to ensure application, at each activation well 26, of a positive hydrostatic pressure to the respective portion of the mirror 12. More specifically, the liquid metal 34 in each activation well 26 contacts a respective region 25 of the under-surface 18 and applies a respective upward force to the region. The magnitude of the force is proportional to the product of the hydrostatic pressure of liquid metal 34 in the activation well 26 and the area of the region 25 contacted by the liquid metal. Thus, the liquid metal 34 in each activation well 26 acts in the manner of a respective "piston" pressing against the corresponding region of the under-surface 18.

If the mirror 12 were removed from the recess 22, the liquid metal 34 in each activation well 26 would exhibit characteristics associated with its high surface tension. For example, liquid metal tends to form a reverse meniscus (convex meniscus) in the activation wells in the same manner as does mercury in a glass conduit. The high surface tension inhibits overflow of liquid metal 34 from the activation wells 26 (especially if the activation wells are clean and debris-free), which is useful for preventing leakage of liquid metal from the activation wells even as the liquid metal is applying hydrostatic force to the mirror 12. (If necessary, the activation wells 26 can be treated to increase their "liquid-metal-phobicity.") The surface tension of the liquid metal 34 is also useful because it ensures that, as the liquid metal is applying hydrostatic pressure against the mirror 12, respective small gaps (e.g., 100 μm or less) of liquid metal are formed between the tops of the activation wells 26 and the respective regions 25 of the under-surface 18. With the surface tension of the liquid metal, the gaps are sufficiently small to prevent liquid metal from leaking out of the activation wells 26. Also, the gaps desirably prevent the under-surface 18 from actually contacting the tops of the activation wells 26.

The optical element 12 can be made of any of various materials, selected based on the configuration of the element, its intended use, its environment of use, its required fabrication tolerances, etc. Candidate materials include, but are not limited to, glasses, silica, ceramics, ZERODUR® (Schott, Germany), and metals. Desirably, the selected material is inert to the liquid metal 34, particularly within normal ranges of operational temperature. Especially if the optical element 12 is made of metal, the liquid metal 34 should be selected with the material of the optical element in mind, since some metals are incompatible with liquid metals.

The manifold 14 is made of any appropriate material that is highly rigid, thermally conductive, and inert to the liquid metal 34. Example materials include, but are not limited to, any of the various materials used for fabricating the mirror 12. The manifold 14 desirably includes conduits 38 through which a fluid (e.g., liquid) coolant is circulated to cool and control the temperature of the manifold. The coolant conduits 38 are located so as not to interfere with the liquid-metal conduits 28. An example coolant is water. Other possible coolants include, but are not limited to: fluorinated liquids such as Fluorinert® from 3M. An example controlled temperature is 20±0.03° C. As a result of the gaps between the tops of the activation wells 26 and the under-surface 18, distortions in the manifold 14 caused by temperature change or other factor do not translate significantly to any corresponding distortion of the mirror 12.

To change the hydrostatic pressure being exerted by a given activation cell 26 against the respective region 25 of the under-surface 18, the level of liquid metal 34 in the corresponding access well 32 is changed within a range in which the liquid-metal level in the access well would remain above the level of the under-surface 18 if the liquid metal were not constrained. Adding liquid metal 34 to an access well 32 essentially increases the liquid column in the access well, which correspondingly increases the pressure downstream of the liquid column. Conversely, removing liquid metal 34 from an access well decreases the liquid column and correspondingly decreases the pressure. For changing the level of liquid metal 34 in the access well 32, a transfer stylus 40 is used in this embodiment. (A positive-displacement device such as a syringe could be used instead of the transfer stylus 40 for adding or removing liquid metal if the active optical element 10 is not in a vacuum environment. But, in a vacuum environment, syringe-like devices do not work well or at all.)

A single transfer stylus 40 can be used to add or remove liquid metal 34 individually from the access wells 32. Alternatively, multiple transfer styli can be used for controlling liquid-metal levels in respective groups of access wells. In the depicted embodiment, for controlled positioning relative to the access wells 32, the transfer stylus 40 is mounted on a mechanism (not detailed, but see arrows 31) that moves the stylus controllably in the x-y plane. The mechanism also is configured to move the transfer stylus 40 controllably in the z-direction (arrows 33), toward and away from a selected access well 32, for adding liquid metal 34 to, and removing liquid metal from, the access well.

The transfer stylus 40 is basically a temperature-controlled, movable post. Its temperature is controllable over a range that includes the temperature at which the liquid metal changes from a solid to a metal. To add liquid metal 34 to an access well 32, the transfer stylus 40 is moved to and dipped into a liquid-metal reservoir 35 while being reduced in temperature ("chilled") sufficiently for an amount of liquid metal in the reservoir to solidify on the stylus. The chilled transfer stylus 40 is moved to the selected access well 32, at which the temperature of the stylus is raised sufficiently to melt the liquid metal adhering to it, which releases the liquid metal into the access well and correspondingly raises the level of liquid metal in the access well. To remove liquid metal 34 from the access well 32, the transfer stylus 40 is moved to and dipped into the access well while being chilled sufficiently for an amount of liquid metal in the access well to solidify on it. While chilled, the transfer stylus 40 is then moved to the reservoir 35, at which the temperature of the stylus is raised sufficiently to "melt" the liquid metal adhering to it, thereby releasing the liquid metal into the reservoir. These actions and motions are readily performed in a robotic manner, controlled by a controller 66 coupled to the stylus 40 and to its movement mechanism. For monitoring the amount of liquid metal 34 picked up and delivered, the transfer stylus 40 desirably includes a force sensor (not shown) such as, but not limited to, a calibrated strain gauge. The transfer stylus 40 can also comprise a sensor (not shown) for sensing the height of liquid metal in an access well 32. Such a sensor can be a stylus-position sensor (used in the stylus-movement robotics for providing positional feedback) working cooperatively with, for example, an electrical continuity or conductivity sensor that detects actual contact of the stylus 40 with liquid metal 34 in an access well 32.

Adding liquid metal 34 to an access well 32 elevates the level of liquid metal in the access well, which increases the hydrostatic pressure applied by the respective activation well 26 to the corresponding region 35 of the under-surface 18. Increasing the hydrostatic pressure increases the upward force being applied to the corresponding region 35 of the under-surface 18, which produces a respective distortion of the corresponding portion of the reflective surface 16. The distortion is utilized as a correction displacement of the reflective surface 16. Removing liquid metal 34 from the access well 32 has the opposite effect. In either event, the amount of liquid metal 34 added or removed is small, and the corresponding amount of correction displacement imparted to the reflective surface 16 is extremely small, normally in the range of tens of nanometers or less.

The diameter (or other transverse dimension) of the activation wells 26 is selected so that their corresponding piston-areas are sufficient to produce a desired range of force. If the piston-areas are too small, then the forces producible by the activation wells 26 may be too low to have any significant effect on mirror-surface correction. Piston-area is selected also by considering the thickness and geometry of the mirror 12 and the desired spatial density of activation wells 26. The spatial density of activation wells 26, in turn, depends upon the spatial frequency of distortion or other errors in the reflective surface 16 that require correction. Correction of a higher spatial frequency of errors generally requires application of greater hydrostatic forces to the under-surface 18. Therefore, selection of the piston-areas depends on, inter alia, the particular mirror 12 and the specifications on errors and amounts of correction needed.

Desirably, the mirror 12 is configured so that required corrections are achieved, at least to some degree, by the activation wells 26 "pushing" (applying respective hydrostatic pressures to) the respective regions on the under-surface 18. This avoids, in this embodiment, having to apply a "pulling" force to any regions of the mirror to achieve correction. Limiting the forces to pushing forces requires that the level of liquid metal 34 in each of the access wells 32 be higher than the tops of the actuation wells 26. In addition, if necessary or desired, the mirror 12 can be fabricated to include appropriate preloading in one or more locations, generally in the opposite direction of the hydrostatic forces applied to the mirror, so that piston pushing improves rather than deteriorates optical performance. Preloading during fabrication can be achieved by pre-shaping or pre-distorting the mirror 12 by, for example, placing weights selectively on or about the mold used for casting the mirror. Alternatively or in addition, weights can be selectively attached to the mirror, during actual use of the mirror, at locations that produce desired preloads.

As noted, the restrictor conduits 30 have less diameter (or other transverse dimension) than either of the wells 26, 32.

This reduced relative diameter is useful in many embodiments for various reasons, especially (but not limited to) for damping vibrations. Since the liquid metal 34 actually contacts the under-surface 18 of the mirror 12, the mass of liquid metal 34 is vibrationally coupled to the mass of the mirror 12. Normally, the greater the combined mass of mirror 12 and liquid metal 34, the lower the natural vibration frequency of the mirror. Normally, the greater the mass coupled to the mirror 12, the lower the natural frequency of mirror vibration. Limiting or eliminating lower vibration frequencies is desirable because lower-frequency vibrations otherwise can have large amplitudes, and large-amplitude vibrations of the mirror 12 can cause blur and other optical problems and are difficult to attenuate. Also, lower-frequency vibrations can generate various vibration modes that are also troublesome and difficult to attenuate. Higher-frequency vibrations tend to have lower amplitudes and tend to generate fewer vibration modes, and hence are less difficult to attenuate.

In conventional optical systems, particularly those used at ambient pressure, most vibration attenuation is achieved from viscous drag between the structure and ambient air. However, EUV lithography is an example process that is performed in a vacuum. Hence, in an optical system of an EUV lithography system, viscous damping of the optical system must rely on something other than ambient air.

Attenuating low-frequency vibrations of the mirror 12 is achieved in this embodiment by reducing the diameters of the restrictor conduits 30 relative to the wells 26, 32. Since the liquid metal 34 is coupled to the mirror 12, mirror vibrations can produce corresponding displacements (back and forth) of the liquid metal in the conduits 28. Decreasing the diameter of the restrictor conduits 30 narrows and increases the velocity of this flow, which absorbs vibration energy (by converting the kinetic energy of the liquid metal to heat energy) and attenuates various vibration modes of the mirror 12. An exemplary damping target for natural vibration frequencies is 300 Hz or greater.

Figure 2A:
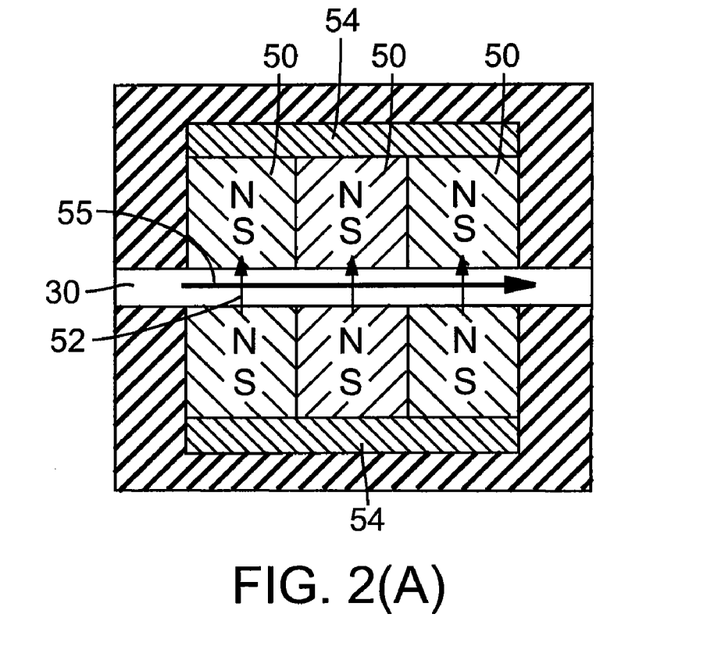
FIGS. 2(A)-2(C) are respective schematic orthogonal views of an exemplary restrictor conduit of the first embodiment, with associated device for applying a magnetic field to the liquid metal in the restrictor conduit.
Figure 2B:
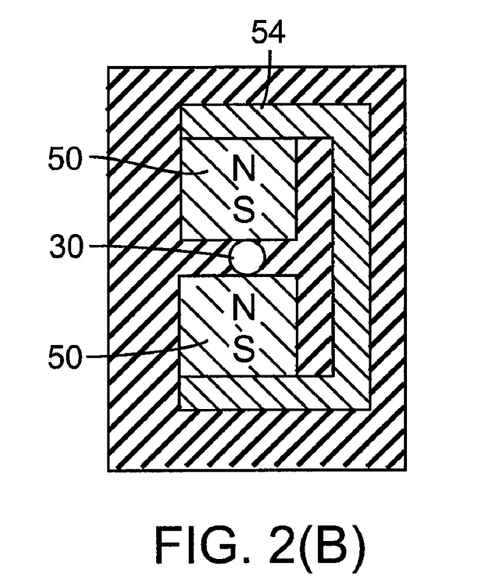

Vibration attenuation can be further facilitated by placing magnetic fields across the restrictor conduits 30 or across other locations in the liquid-metal conduits 28 in which liquid metal flows at higher velocity. An example configuration is shown in FIGS. 2(A)-2(B), in which a restrictor conduit 30 is flanked by an array of permanent magnets 50 that produce a magnetic field 52. The magnetic field 52 is oriented substantially perpendicularly to the direction 55 of liquid flow (in the direction of the longitudinal axis of the restrictor conduit 30). The magnets 50 have the same orientation, and the array is situated in a yoke 54, which increases the magnitude of the magnetic field 52 in the region of the restrictor conduit 30. (If a yoke 54 is not used, then a Halbach magnet arrangement would be necessary.) The liquid metal 34 moving through the magnetic field 52 generates eddy currents in the liquid metal 34 in the restrictor conduit 30. The eddy currents, in turn, locally heat the liquid metal in the restrictor conduit 30, which produces a damping effect on vibrations by removing energy from corresponding movement of the liquid metal through the restrictor conduit.

The permanent magnets 50 can be replaced or augmented by electrical coils arranged so that, when the coils are energized electrically, magnetic fields are produced that are oriented substantially perpendicularly to the axis of the restrictor conduit 30.

The optical performance of the mirror 12 desirably is sensed to provide feedback data used for determining the respective corrections to the surface 16 imparted by the activation wells 26. Sensing desirably is performed off-axis, using a beam 62 of sensing light produced by a source 60. The beam 62 reflected from the surface 16 propagates to a sensor 64, such as a Shack-Hartmann sensor. The sensor 64 is connected to the controller 66 to which the transfer stylus 40 is also connected. Based on data produced by the sensor 64, the controller 66 produces corresponding data for controlling amounts of liquid metal 34 added to or removed from respective access wells 32 to control respective forces applied to respective regions 25 of the optical element 12 by the activation wells 26. In other words, based on the data from the sensor, the controller 66 controls the x, y, z position and motions of the transfer stylus 40 as well as its temperature, as functions of time, resulting in appropriate forces being applied where needed on the under-surface 18 to achieve a desired correction of the optical surface 16.

In FIG. 1 the optical element 12 is depicted as a mirror or other reflective optical element. In alternative embodiments the optical element 12 is a non-mirror element such as a prism, window, grating, reticle, or the like, or a refractive element such as a lens. If the optical element is a lens, the activation wells can be located on the reverse surface of the element in a peripheral zone surrounding the region of the lens that receives incident light. Reflective optical elements, especially those having an under-surface 18 that is not the reflective surface 16, are perhaps more readily usable because activation wells 26 can be distributed substantially over the entire under-surface 18. The size of the optical element 12 is not normally a limiting factor. The principles described herein can be scaled up or down for use with larger or smaller, respectively, optical elements. For example, a larger optical element may accommodate a larger number of activation wells, and/or larger activation wells, than a smaller element.

In FIG. 1, the under-surface 18 is planar, which is desirable from a practical standpoint, but planarity is not required. In alternative embodiments the under-surface 18 has a profile other than planar, such as convex or concave. A planar under-surface 18 is desired for simplicity of construction and operation, but the activation wells 26 certainly can be used with a non-planar under-surface.

In FIG. 1 the access wells 32 are all shown having the same transverse dimension (diameter). This is not intended to be limiting; in alternative configurations, the transverse dimensions can vary as desired.

The optical element 12 and manifold 14 can be mounted to the same frame (not shown) or to different frames. A concern with a common frame is vibration transmission, via the frame, from the manifold 14 directly to the optical element 12. An example source of such vibration in the manifold 14 is the conduction of liquid coolant to, and circulation of coolant through, the conduits 38. Desirably, these vibrations are not transmitted to the optical element. Mounting the optical element 12 and manifold 14 on separate frames may reduce transmission of vibrations in the manifold to the optical element. But, careful attention should be given to the manner in which the frames are mounted to, and relative to, each other. A mirror mounted on an isolated frame can produce a net force on the frame such that, if the position of the frames relative to each other changes, the buoyant forces being applied to the mirror could change. Fortunately, transmission of vibrations from the manifold 14 to the optical element 12 via the liquid metal 34 tends to be low. In either event, the optical element 12 desirably is mounted in a kinematic manner.

Although FIG. 1 depicts the reflective surface 16 as being coplanar with the top surface of the manifold 14, such coplanarity is not required. As noted above, it is important that the tops of the activation wells 26 be lower than the tops of the access wells 32 (more specifically, lower than the liquid-metal level in any of the access wells 32). So long as this condition exists with respect to the access wells 32 and activation wells 26, the height of the reflective surface 16 relative to the manifold 14 is inconsequential. Maintaining this condition is facilitated by the recess 22 in which the optical element 12 rests, which places the tops of the activation wells 26 below the tops of the access wells 32.

In the embodiment of FIG. 1, flow of liquid metal 34 in the restrictor conduits 30 is largely by hydrostatic pressure, based on pressure differences of the liquid metal in the access wells 32 versus in the respective activation wells 26. In certain alternative embodiments electrohydrodynamic (EHD) "pumping" can be used to move liquid metal through the conduits 30 or to augment use of the force of gravity to move the liquid metal and generate hydrodynamic force. EHD pumping can be used alone or in combination with the hydrostatic-pressure scheme discussed above. When used in combination, the net hydrostatic pressure of the liquid metal on the optical element is a sum of the pressure caused by gravity acting on the liquid metal and by the electromagnetic force acting on the liquid metal by EHD pumping. When EHD is used alone, hydrostatic pressure is still being relied upon to exert pressure on the liquid metal in contact with the surface 18.

Figure 2C:
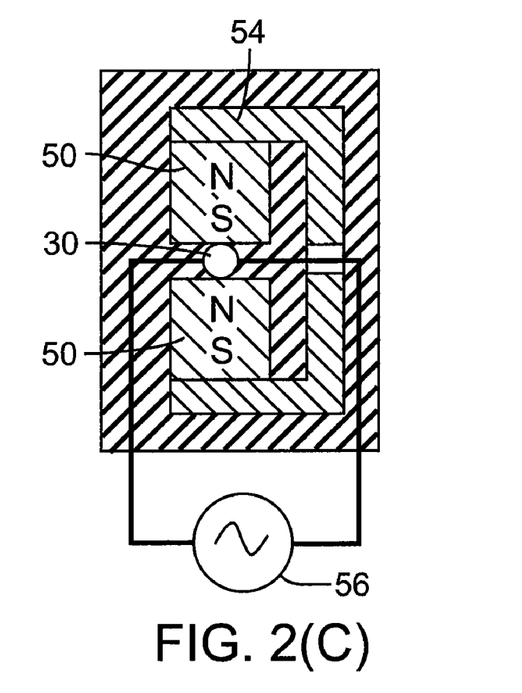

To achieve EHD pumping the liquid metal is subject to magnetic force, as described above, as an electrical current is passed through the liquid metal 34 in a direction perpendicular to both the conduit axis and the magnetic field. This is shown schematically in FIG. 2(C), which is an end view from a direction similar to FIG. 2(B). Shown are the restrictor conduit 30, magnets 50, magnetic field 52, and yoke 54. Fluid flow through the conduit is the same as indicated by the arrow 55 in FIG. 2(A). A source 56 of AC current is connected to the liquid metal in the conduit 30 across the conduit. Hence, the direction of current flow is orthogonal to both the conduit axis (arrow 55) and the magnetic field 52. The current passing through the liquid metal 34 in the conduit 30 can be used to control the hydrostatic pressure exerted by the liquid metal on the respective locations on the under-surface 18 of the optical element 12. Heat generated by ohmic losses in the liquid metal 34 is absorbed by heat exchange involving the manifold 14 and coolant conduits 38. Vibration damping using EHD pumping simply involves applying the current in response to corresponding vibrations (desirably under feedback control) to offset the vibrations in real time. Just as the restrictor conduits 30 slow the movement of liquid metal relative to the manifold 14, converting the kinetic energy of the liquid to heat energy, the EHD pumping system moves the liquid metal relative to the manifold in a manner that also slows the liquid velocity and converts the kinetic energy into heat energy. The magnitude of the current applied to the liquid metal can also be monitored and changed to damp vibrations in an adaptive-optics manner. Hence, this alternative configuration can be used not only for active-optics control of the shape of the surface 16 but also for vibration attenuation.

Although this embodiment is depicted with one access well per actuation well, this is not intended to be limiting. It is possible, for example, to connect a given actuation well to more than one access well, or more than one actuation well to a given access well. In addition, it is also possible that one or more actuation wells are not connected to respective access wells.

It will be understood that the configuration of this embodiment into and out of the plane shown in FIG. 1 is substantially the same as shown.

In summary, this and other embodiments provide the following:

(a) Liquid metal 34 in the manifold 14 provides hydrostatic pressure at discrete locations on the reverse surface 18 of the mirror 12 to deform the mirror.

(b) Varying the height of liquid metal 34 in the access wells 32, by adding or removing liquid metal, changes the hydrostatic pressure at the discrete locations on the reverse surface 18.

(c) A movable, temperature-adjustable transfer stylus 40 is used to add, remove, and transfer liquid metal 34. Excess liquid metal 34 is stored in a reservoir.

(d) Restrictor conduits 30 in the liquid-metal conduits 28 provide damping.

(e) Coolant flowing through the conduits 38 removes heat from the assembly.

(f) The mirror 12 can be fabricated to account for initial, non-adjusted pressures applied thereto by the liquid metal 34.

(g) Heat is conducted away from the mirror 12 through the liquid-metal interface between mirror and manifold, without over-constraining the mirror.

(h) The mirror 12 and manifold 14 can be connected to a common frame or to separate frames.

(i) "Phobic" surfaces on the manifold 14 and the reverse surface 18 prevent high-surface-tension liquid metal 34 from squeezing out into the gap between the mirror 12 and the manifold.

Second Representative Embodiment

Figure 3:
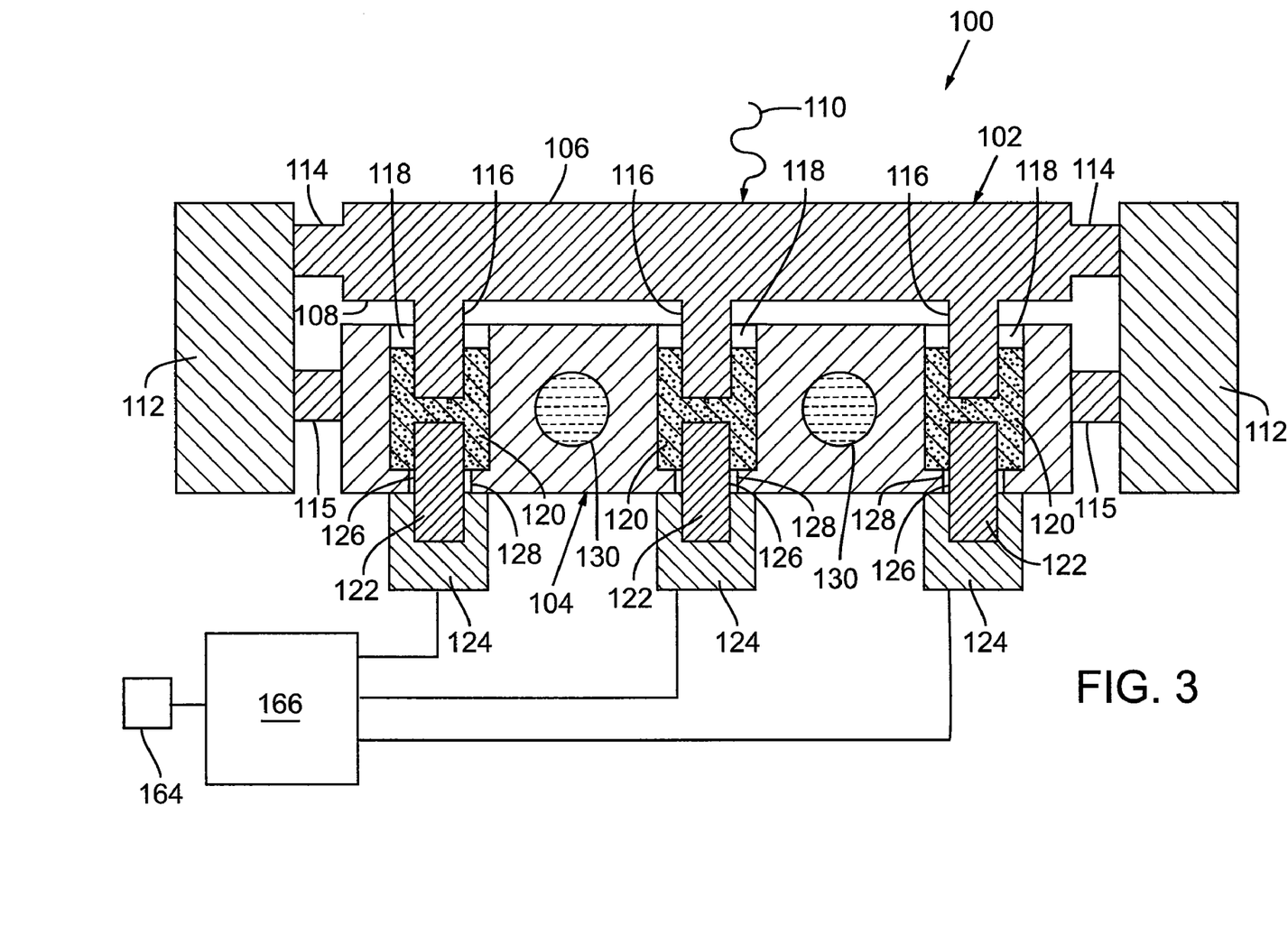
FIG. 3 is a vertical section of a second embodiment.

A second representative embodiment of an active optical element 100 is shown in FIG. 3. Shown are a reflective optical element ("mirror") 102 and a manifold 104. The optical element 102 has a reflective surface 106 and an under-surface 108 (also called a "reverse surface"). The reflective surface 106 receives and reflects incident radiation 110. The optical element 102 is situated substantially horizontally, with the reflective surface 106 facing upward.

The optical element 102 and manifold 104 are situated relative to a frame 112, and are connected to the frame by kinematic connectors 114, 115, respectively, providing constraint (but not over-constraint) in each of the six DOFs. The frame 112 is, for example, a mirror cell or optical frame, and can be mounted to a system frame (not shown) using anti-vibration mountings (not shown) to isolate the frame 112 from extraneous sources of vibration.

Mounted to the under-surface 108 are fixed posts 116. The fixed posts 116 extend, downward from the under-surface 108, into respective wells 118 each containing a respective volume of liquid metal 120. Also extending into the wells 118, from below, are movable posts 122. Each movable post 122 is associated with a respective linear actuator 124 that, when actuated, imparts a respective small amount of linear push or pull motion to the post. Example linear actuators 124 include, but are not limited to, piezo-electric actuators, pneumatic actuators, voice-coil motors, EI devices, and screws driven by respective DC motors or ultrasonic motors. An example ultrasonic motor is the Picomotor® from New Focus, San Jose, Calif. An example DC motor is the DC Mike® from Physik Instrumente, Germany. As a movable post 122 is pushed upward by its actuator 124 further into its respective well 118, liquid metal 120 in the well is correspondingly displaced upward, which increases the buoyant force on the respective fixed post 116. Similarly, as an actuator 124 pulls a movable post 122 downward into its respective well 118, the liquid metal 120 in the well is correspondingly displaced downward, which reduces the buoyant force on the fixed post 116. Thus, motion of the movable posts 122 increases or decreases respective buoyant forces being applied to respective regions on the under-surface 108 of the optical element 102.

The optical element 102 can have an orientation other than horizontal so long as the liquid metal 120 does not spill out of the wells 118. To inhibit spillage of liquid metal 120 in these other orientations, the wells 118 and posts 116 can be configured such that the level of liquid metal always remains sufficiently below the tops of the wells. Support of the optical element 102 by the kinematic connectors 114 and by the hydrostatic pressure applied by the liquid metal 120 in the wells 118 to the posts 122 prevents the optical element from actually contacting the manifold 104.

The movable posts 122 extend through corresponding bores 126 in the manifold 104. If required, to prevent leakage of liquid metal 120 from the wells 118 via the bores 126, sliding seals 128 or the like can be provided in the manifold 104 around the movable posts 122. Alternatively, the bores 126 and/or the movable posts 122 can be made "liquid-metal-phobic" with the posts being slip-fit in their respective bores.

As in the first embodiment, the manifold 104 is made of any appropriate material that is highly rigid, thermally conductive, and inert to the liquid metal 120. The manifold 104 desirably includes conduits 130 through which a fluid coolant (desirably a liquid coolant) is circulated to cool and control the temperature of the manifold. The coolant conduits 130 are located so as not to interfere with the wells 118.

In FIG. 3, the under-surface 108 is planar, which is desirable from a practical standpoint, but planarity is not required. In alternative embodiments the under-surface 108 has a profile other than planar, such as convex or concave. A planar under-surface 108 is desired for simplicity of construction and operation.

The optical performance of the mirror 102 desirably is sensed to provide feedback data used for determining the respective corrections to the surface 116 imparted by the movable posts 122. As in the first embodiment, sensing desirably is performed off-axis, using a beam of sensing light produced by a source, wherein the beam reflected from the surface 116 propagates to a sensor 164 such as a Shack-Hartmann sensor. See discussion with respect to the first embodiment. Based on data produced by the sensor, a controller 166 produces corresponding data for controlling the amounts of push and pull applied to the posts 122 by the linear actuators 124 to control respective buoyant forces applied to the mirror 102.

In FIG. 3 the optical element 102 is depicted as a mirror or other reflective optical element. In alternative embodiments the optical element is a non-mirror element such as a prism, window, grating, reticle, or the like, or a refractive element such as a lens, as discussed in connection with the first embodiment. The size of the optical element 102 is not normally a limiting factor. The principles described herein can be scaled up or down for use with larger or smaller, respectively, optical elements. For example, a larger optical element may accommodate a larger number of movable posts and actuators than a smaller element.

A first alternative embodiment to that shown in FIG. 3 lacks fixed posts 116. Rather, as in the first embodiment, the wells 118 open on or near the upper surface of the manifold 104, and the optical element 102 is situated relative to the tops of the wells.

A second alternative embodiment to that shown in FIG. 3 does not have respective individual actuators for each movable post but rather has one or more mobile actuators that are movable from one movable post to the next. Upon moving to a particular movable post, the actuator engages the movable post and moves it as required to change the hydrostatic pressure in the respective cell.

Third Representative Embodiment

Figure 4:
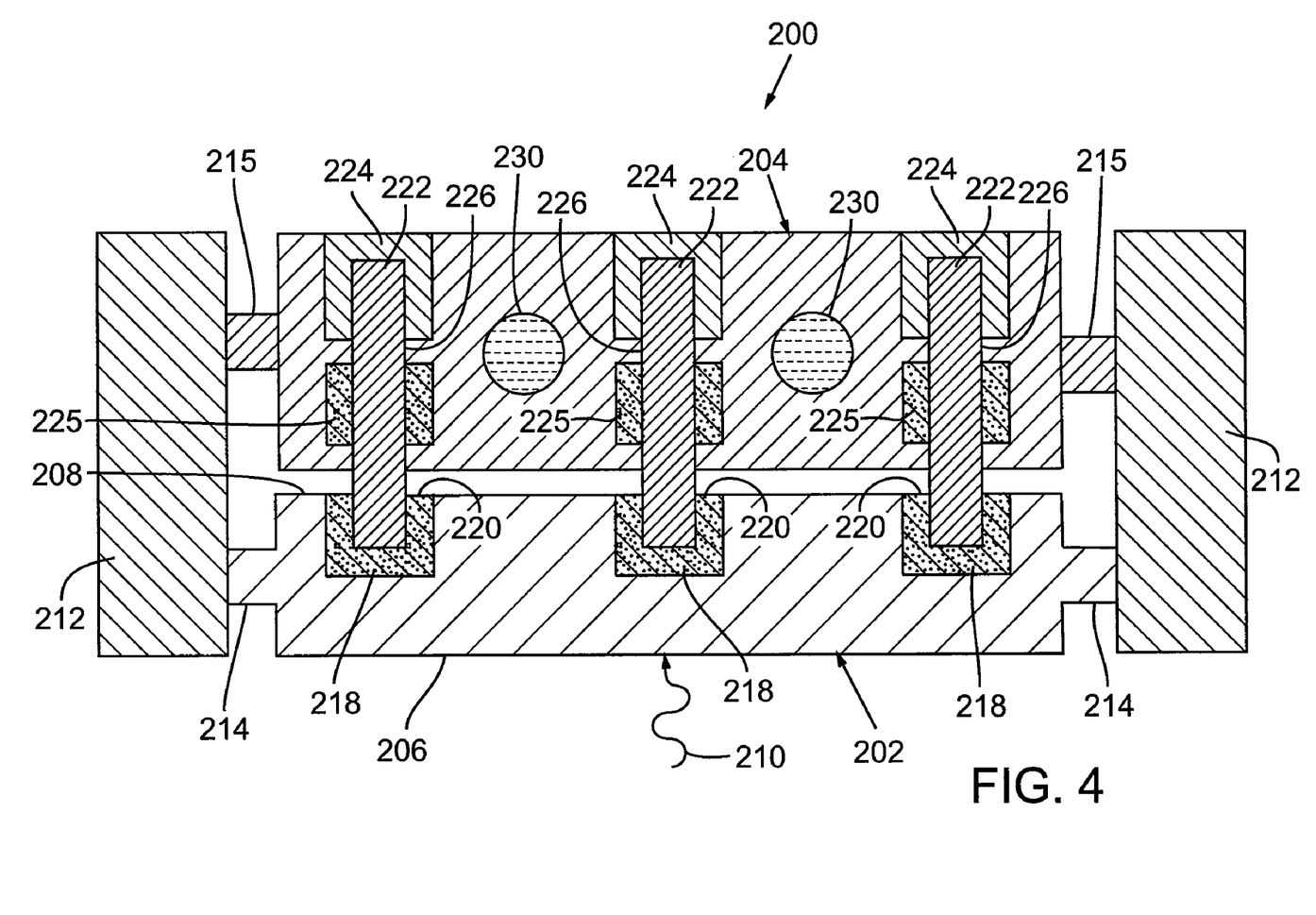
FIG. 4 is a vertical section of a third embodiment.

A third representative embodiment of an active optical element 200 is shown in FIG. 4. Shown are a reflective optical element ("mirror") 202 and a manifold 204. The optical element 202 has a reflective surface 206 that faces downward. The optical element also has an upper surface 208 (also called the "reverse surface"). The reflective surface 206 receives and reflects incident radiation 210. The optical element 102 is situated substantially horizontally in this embodiment.

The optical element 202 and manifold 204 are situated relative to a frame 212, and are connected to the frame by kinematic connectors 214, 215, respectively, providing constraint (but not over-constraint) in each of the six DOFs. The frame 212 is, for example, a mirror cell or optical frame, and can be mounted to a system frame (not shown) using anti-vibration mountings (not shown) to isolate the frame 212 from extraneous sources of vibration.

The manifold 204 includes multiple linear actuators 224, with which respective movable posts 222 are associated, as discussed above. The movable posts 222 extend downward, past the under-surface 205 of the manifold 204 into respective wells 218 on the upper surface 208 of the mirror 202. The wells 218 contain respective volumes of liquid metal 220. Whenever a linear actuator 224 is actuated, the actuator imparts a respective small amount of linear pushing or pulling motion to the respective post 222. As a movable post 222 is pushed downward by its actuator 224 further into its respective well 218, the buoyant force applied by the liquid metal 220 in the well to the post correspondingly rises. Similarly, as an actuator 224 pulls a movable post 222 further out of its respective well 218, the buoyant force applied by the liquid metal 220 in the well to the post correspondingly drops. These changes in buoyant forces produce corresponding changes in respective regions of the reflective surface 206.

The movable posts 222 extend, from their respective actuators 224, downward through respective bores 226 and through respective chambers 225 containing liquid metal 220. The purpose of the liquid-metal-filled chambers 225 is to conduct heat transfer from the movable posts 222 to the manifold 204. (It is possible to conduct heat directly between contacting portions of the posts 222 and the manifold 204, but this would inefficient in a vacuum environment.) If required, to prevent leakage of liquid metal 220 from the chambers 225 via the bores 226, sliding seals (not shown) or the like can be provided in the manifold 204 around the movable posts 222. Alternatively, the bores 226 and/or the movable posts 222 can be made "liquid-metal-phobic" with the posts being slip-fit in their respective bores.

As in the first and second embodiments, the manifold 204 is made of any appropriate material that is highly rigid, thermally conductive, and inert to the liquid metal 220. The manifold 204 desirably includes conduits 230 through which a fluid coolant (desirably a liquid coolant) is circulated to cool and control the temperature of the manifold. The coolant conduits 230 are located so as not to interfere with the actuators 224.

The optical element 202 is shown as being horizontal, but can have an orientation other than horizontal so long as the liquid metal 220 does not spill out of the wells 218. To inhibit spillage of liquid metal 220 in these other orientations, the wells 218 and posts 216 can be configured such that the level of liquid metal always remains sufficiently below the tops of the wells. Support of the optical element 202 by the kinematic connectors 214 and by the hydrostatic pressure applied by the liquid metal 220 in the wells 218 to the posts 222 prevents the optical element from actually contacting the manifold 204.

In view of the foregoing description, the following are notable features of the embodiments:

(a) They are relatively low in cost and complexity, while being robust.

(b) They provide the optical element with multiple actuation points.

(c) They can be used in a vacuum environment since most of the candidate liquid metals have extremely low vapor pressures.

(d) In addition to actively controlling performance of the optical element, they effectively transfer heat from the optical element without over-constraining the optical element, especially since the manifold is mechanically de-coupled from the optical element in many embodiments.

(e) The actuators do not over-constrain the optical element.

(f) The actuators in some embodiments (e.g., first embodiment and other embodiments using a screw-type linear actuator) do not require power to maintain their force.

(g) No adhesives or special machining of the optical element is required.

Figure 5:
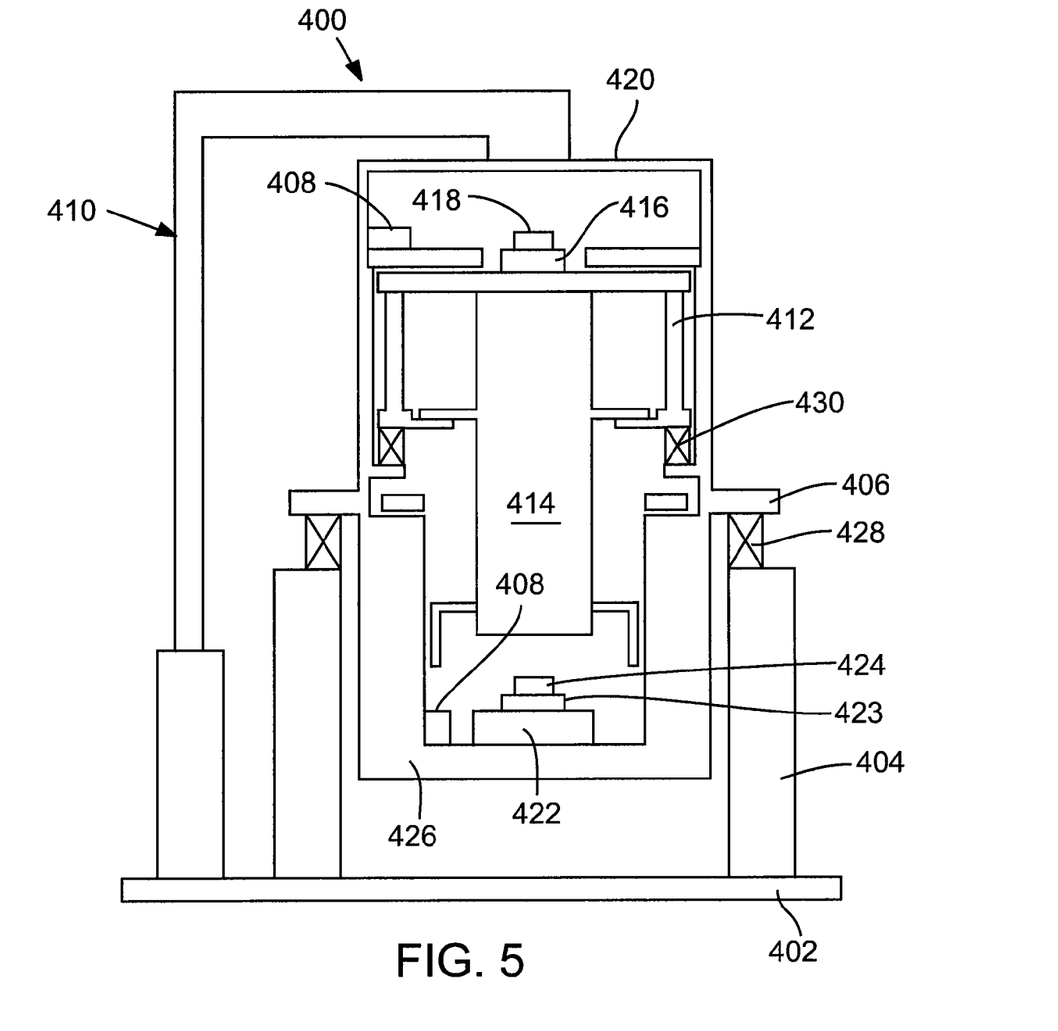
FIG. 5 is an elevational diagram of an embodiment of a lithographic exposure system incorporating an optical system as described herein.

FIG. 5 shows a typical lithographic exposure system 400 incorporating an optical system that comprises a mounted optical element as described above. The system 400 comprises a mounting base 402, a support frame 404, a base frame 406, a measurement system 408, a control system (not shown), an illumination-optical system 410, an optical frame 412, an optical system 414, a reticle stage 416 for holding and moving a reticle 418, an upper enclosure 420 surrounding the reticle stage 416, a substrate stage 422 for holding and moving a lithographic substrate (e.g., a semiconductor wafer), and a lower enclosure 426 surrounding the substrate stage 422. The illumination-optical system 410 and/or the optical system 414 can include an optical element mounted in the manner described above. The substrate stage 422 is mounted on a substrate table 423.

The support frame 404 typically supports the base frame 406 above the mounting base 402 via a base vibration-isolation system 428. The base frame 406, in turn, supports (via an optical vibration-isolation system 430) the optical frame 412, the measurement system 408, the reticle stage 416, the upper enclosure 420, the optical device 414, the substrate stage 422, the substrate table 423, and the lower enclosure 426 about the base frame 406. The optical frame 412, in turn, supports the optical device 414 and the reticle stage 416 above the base frame 406 via the optical vibration-isolation system 430. As a result, the optical frame 412, the components supported thereby, and the base frame 406 are effectively attached in series, via the base vibration-isolation system 428, to the mounting base 402. The vibration-isolation systems 428, 430 are configured to damp and isolate vibrations between components of the exposure system 400; each of these systems comprises a vibration-damping device. The measurement system 408 monitors the positions of the stages 416, 422 relative to a reference such as the optical device 414 and outputs position data to the control system. The optical device 414 typically includes a lens assembly that projects and/or focuses light or a light beam from the illumination-optical system that passes through or reflects from the reticle 418. The reticle stage 416 is attached to one or more movers (not shown) directed by the control system to position the reticle 418 precisely relative to the optical device 414. Similarly, the substrate stage 422 includes one or more movers (not shown) to position the substrate 424 with the substrate table 423 precisely relative to the optical device (lens assembly) 414.

As will be appreciated by persons of ordinary skill in the relevant art, there are a number of different types of photolithographic systems. For example, the exposure system 400 can be a scanning-type photolithography system that progressively exposes a pattern from the reticle 418 onto a substrate 424 as the reticle 418 and substrate 424 are moved synchronously. The reticle 418 is moved perpendicularly to the optical axis of the optical device 414 by the reticle stage 416 as the substrate 424 is moved perpendicularly to the optical axis of the optical device 414 by the substrate stage 422. Scanning of the reticle 418 and the substrate 424 occurs while the reticle 418 and the substrate 424 are moving synchronously.

Alternatively, the exposure system 400 can be a step-and-repeat type of photolithography system that exposes the reticle 418 while the reticle 418 and substrate 424 are stationary. The substrate 424 is in a constant position relative to the reticle 418 and the optical device 414 during exposure of an individual field. Subsequently, between consecutive exposure steps, the substrate 424 is consecutively moved by the substrate stage 422 perpendicularly to the optical axis of the optical device 414 so that the next field of the substrate is brought into position relative to the optical device 414 and the reticle 418 for exposure. Following this process, the pattern defined on the reticle 418 is sequentially exposed onto the fields of the substrate 424 so that the next field of the substrate 424 is brought into position relative to the optical device 414 and the reticle 418.

The use of an exposure system 400 provided herein is not limited to a photolithography system as used for semiconductor-device manufacturing. The exposure system 400, for example, can be used as an LCD photolithography system that exposes the pattern of a liquid-crystal display (LCD) device onto a planar glass plate or as a photolithography system used for manufacturing a thin-film magnetic head. Further alternatively, the system 400 can be used to perform proximity photolithography. In proximity photolithography (used, e.g., for exposing mask patterns) a mask and the substrate are positioned very closely together axially and exposed without the use of a lens assembly therebetween. In general, the system 400 can be used in any of various other applications, including other semiconductor-processing applications, machine tools, cutting machines, and inspection machines, particular machinery in which it is important to prevent transmission of vibrations to optical elements.

The illumination source (of the illumination-optical system 410) can be g-line (436 nm), i-line (365 nm), KrF excimer laser (248 nm), ArF excimer laser (193 nm), or $F_2$ excimer laser (157 nm). Further alternatively, the illumination source can be an X-ray source or source of "soft" X-rays (extreme ultraviolet light).

With respect to the optical device 414, when a deep-UV source such as an excimer laser is used as the source, glassy materials such as quartz and fluorite that transmit deep-UV rays are preferably used. When an $F_2$ excimer laser or X-ray source is used, the optical device 414 should be either catadioptric or reflective (the reticle, if used, should also be reflective). The optical path for X-rays (including EUV light) should be in a vacuum.

Also, with an exposure system that employs vacuum-UV radiation (wavelength of 200 nm or less), use of a catadioptric optical system can be considered. Examples of the catadioptric type of optical system are disclosed in Japan Patent Publication No. Hei 8-171054, corresponding to U.S. Pat. No. 5,668,672, and Japan Patent Publication No. Hei 10-020195, corresponding to U.S. Pat. No. 5,835,275, all incorporated herein by reference. In these cases, the reflective optical device can be a catadioptric optical system incorporating a beam-splitter and a concave mirror. Japan Patent Publication No. Hei 8-334695 and its counterpart U.S. Pat. No. 5,689,377 and Japan Patent Publication No. Hei 10-003039 and its counterpart U.S. Pat. No. 5,892,117, all incorporated herein by reference, use a reflective-refractive type of optical system incorporating a concave mirror, etc., but without a beam-splitter.

Further, in photolithography systems, if linear motors (see U.S. Pat. Nos. 5,623,853 and 5,528,118, both incorporated herein by reference) are used in the substrate stage or reticle stage, the linear motors can be either air-levitation type, employing air bearings, or magnetic-levitation type, using Lorentz force or reactance force. The stage can move along a guide, or it can be guideless.

Alternatively, one of the stages can be driven by a planar motor, which drives the stage by electromagnetic force generated by a magnet unit, having two-dimensionally arranged magnets, and an armature-coil unit having two-dimensionally arranged coils in facing positions. With this type of driving system, either the magnet unit or the armature-coil unit is connected to the stage, and the other unit is mounted on the moving-plane side of the stage.

Movements of a stage, as described above, generate reaction forces that can affect performance of the photolithography system. Reaction forces generated by the substrate-stage motion can be mechanically released to the floor (ground) using a frame member as described in U.S. Pat. No. 5,528,118 and Japan Patent Publication No. Hei 8-166475, both incorporated herein by reference. Reaction forces generated by the reticle-stage motion can be mechanically released to the floor (ground) using a frame member as described in U.S. Pat. No. 5,874,820 and Japan Patent Publication No. Hei 8-330224, both incorporated herein by reference.

A photolithography system according to the above-described embodiments can be built by assembling various subsystems, including each element listed in the appended claims, in such a manner that prescribed mechanical accuracy, electrical accuracy, and optical accuracy are achieved and maintained. To obtain the various accuracies, prior to and following assembly every optical system is adjusted to achieve its specified optical accuracy. Similarly, mechanical and electrical systems are adjusted to achieve their respective specified mechanical and electrical accuracies. The process of assembling each subsystem into a photolithography system includes mechanical interfaces, electrical-circuit wiring connections, and air-pressure plumbing connections between each subsystem. There is also a process where each subsystem is assembled prior to assembling a photolithography system from the various subsystems. Once a photolithography system is assembled from the various subsystems, total system calibration and adjustment are performed to make sure that each accuracy specification is achieved and maintained in the complete photolithography system. It is desirable to manufacture an exposure system in a clean-room where the temperature, humidity, and particle load are controlled.

Figure 6:
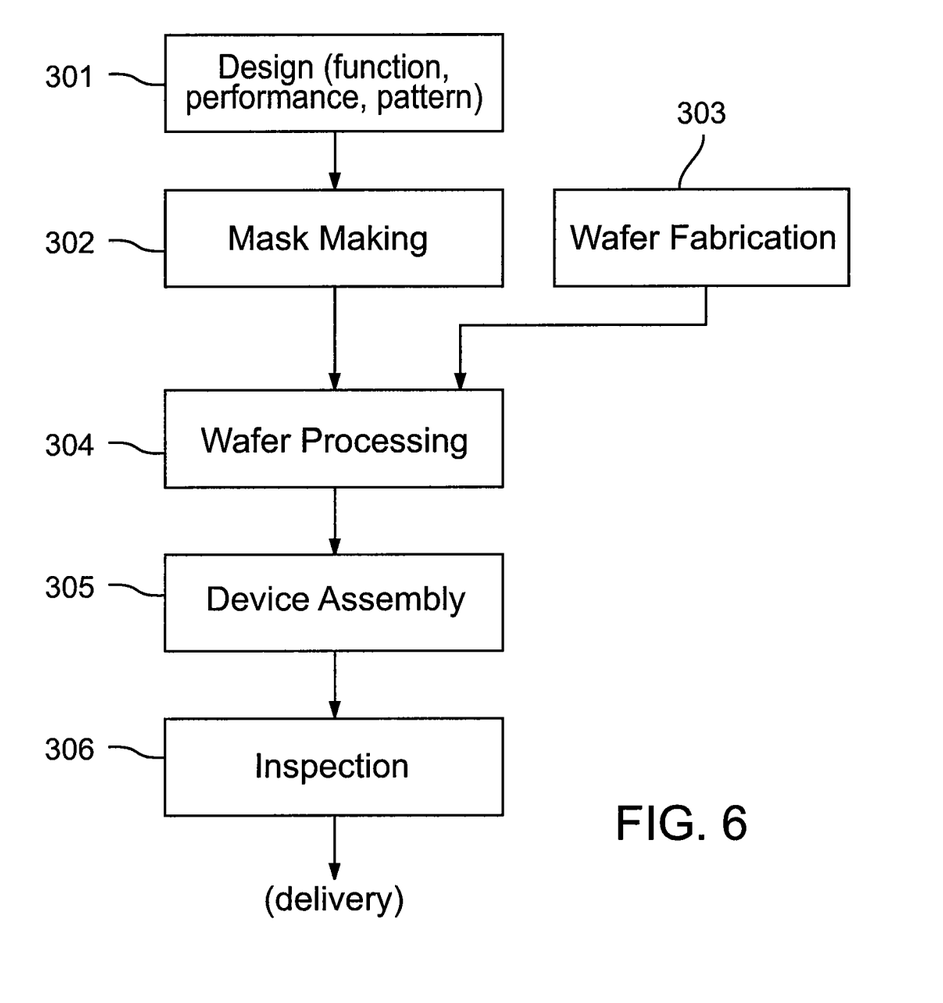
FIG. 6 is a process-flow diagram illustrating an exemplary process by which micro-devices are manufactured using a system as shown in FIG. 5.

Semiconductor devices and other micro-devices can be fabricated using a system as described above, using a process shown generally in FIG. 6. In step 301 the function and performance characteristics of the micro-device are established and designed. In step 302 a mask (reticle) defining a pattern is designed according to the previous design step 301. In a parallel step 303 a substrate (e.g., semiconductor wafer) is made from an appropriate material (e.g., silicon). In step 304 the mask pattern designed in step 302 is exposed onto the substrate from step 303 using a photolithography system such as one of the systems described above. In step 305 the semiconductor device is assembled by executing a dicing step, a bonding step, and a packaging step. The completed device is inspected in step 306.

Figure 7:
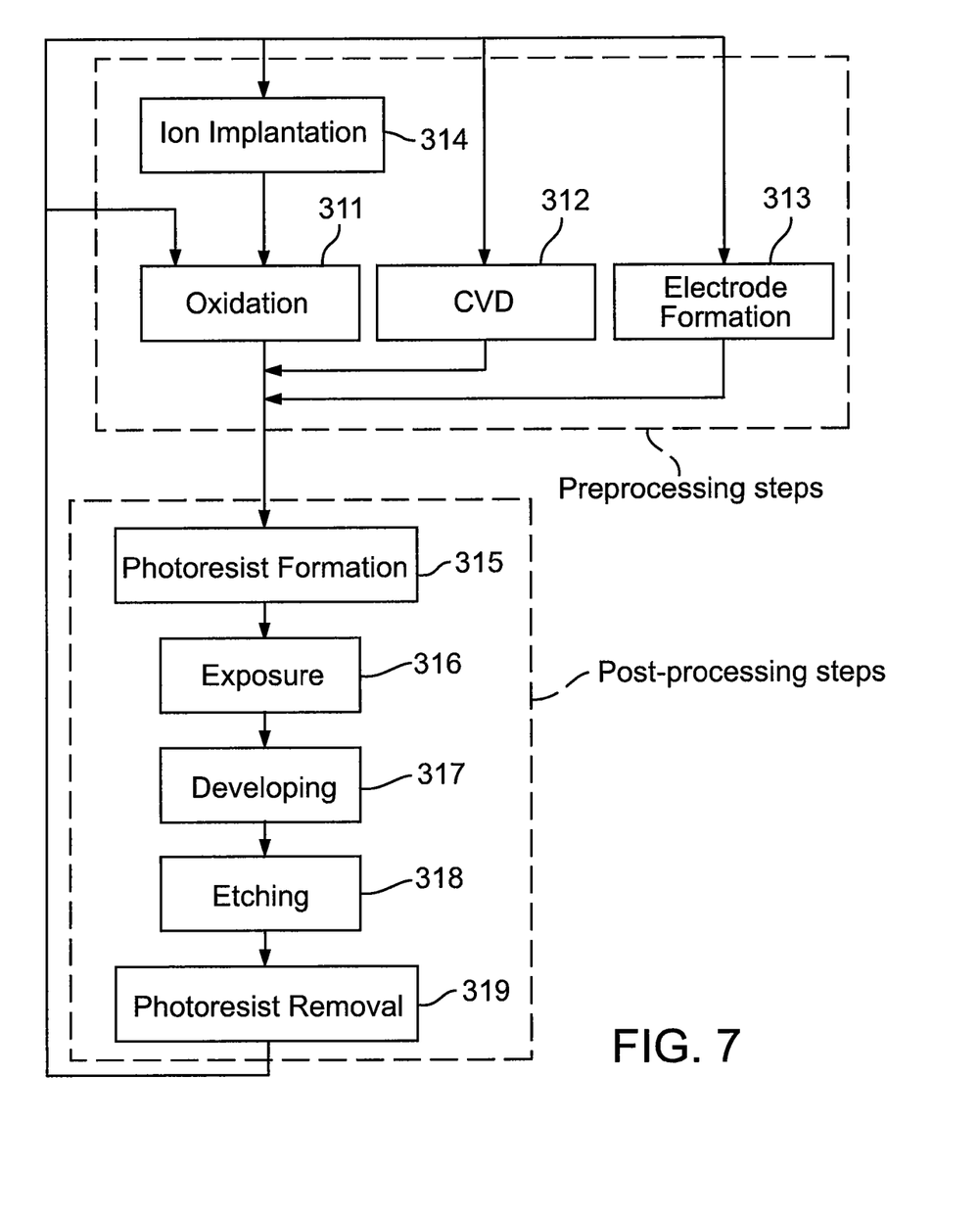
FIG. 7 is a process-flow diagram of the wafer-processing step shown in FIG. 6 in the case of fabricating micro-devices.

FIG. 7 depicts an example flow-chart of step 304 in the case of fabricating semiconductor devices. In step 311 (oxidation) the substrate surface is oxidized. In step 312 (CVD) an insulation layer is formed on the substrate surface. In step 313 (electrode-formation) electrodes are formed on the substrate by vapor deposition or other suitable technique. In step 314 (ion-implantation) ions are implanted in the substrate as required. The steps 311-314 constitute "pre-processing" steps for substrates during substrate processing, and selection is made at each step according to processing requirements.

At each stage of substrate processing, upon completion of the pre-processing steps, the following post-processing steps are performed. In step 315 (photoresist formation) photoresist is applied to the substrate. In step 316 (exposure) the exposure system is used to transfer the circuit pattern of a mask or reticle to the substrate. In step 317 (developing) the exposed substrate is developed. In step 318 (etching) parts other than residual photoresist (i.e., exposed-material surfaces) are removed by etching. In step 319 (photoresist removal) unnecessary photoresist remaining after etching is removed. Multiple circuit patterns are formed by repetition of these pre-processing and post-processing steps.

Whereas the invention has been described in connection with multiple embodiments, it will be understood that it is not limited to those embodiments. On the contrary, it is intended to cover all alternatives, modifications, and equivalents as may be included within the spirit and scope of the invention, as defined by the appended claims.

What is claimed is:

1. An optical component, comprising:
    an optical element having a surface;
    a base member;
    multiple wells corresponding to respective locations on the surface;
    liquid metal contained in the wells and coupled to the respective locations to apply respective hydrostatic pressures to the respective locations; and
    at least one displacement device coupled to at least one well, the displacement device being configured to selectively change the respective hydrostatic pressure applied, relative to the base member, by the liquid metal in the well to the respective location.

2. The optical component of claim 1, wherein:
    the optical element has an optical surface and a reverse surface; and
    the wells correspond to respective locations on the reverse surface.

3. The optical component of claim 2, wherein the liquid metal in the wells is coupled to the respective locations by contact of the liquid metal in the wells to the respective locations.

4. The optical component of claim 3, wherein:
    the base member has a surface facing the reverse surface of the optical element; and
    the wells are situated on the surface of the base member.

5. The optical component of claim 4, wherein:
    the wells are hydraulically coupled to respective access wells primed with liquid metal; and
    respective heights of liquid metal in the access wells produce respective hydrostatic pressures of liquid metal in the wells at the respective locations on the reverse surface.

6. The optical component of claim 5, wherein each well is hydraulically coupled to its respective access well by a respective liquid-metal conduit.

7. The optical component of claim 6, further comprising vibration-reduction devices associated with the conduits.

8. The optical component of claim 7, wherein:
the vibration-reduction devices comprise restrictor conduits interposed in the liquid-metal conduits between the wells and access wells; and
the restrictor conduits have a reduced transverse dimension relative to at least one of the well and access well, to reduce flow velocity of liquid metal in the restrictor conduit relative to in the well or in the access well.

9. The optical component of claim 8, wherein the vibration-reduction devices comprise a magnetic-field source situated relative to the liquid-metal conduits to apply a magnetic field across the liquid metal as the liquid metal flows in the conduits, the magnetic field generating heat-producing eddy currents in the liquid metal that damp vibrations by removing energy from corresponding movement of the liquid metal through the conduit.

10. The optical component of claim 9, wherein the vibration-reduction devices comprise an electrohydrodynamic (EHD) device coupled to the liquid metal in the conduit, to impart motion of the liquid metal in the conduit.

11. The optical system of claim 10, wherein the EHD device is feedback controlled to provide at least vibration damping of the optical element relative to the base member in substantially real time.

12. The optical component of claim 5, further comprising means for adding or removing liquid metal from the access wells.

13. The optical component of claim 2, wherein:
each well includes a respective volume of liquid metal and a respective movable post extending into the respective volume;
the displacement device comprises at least one movable-post actuator; and
a movable post moved by the actuator changes the respective hydrostatic pressure applied by the liquid metal in the respective well to the respective location.

14. The optical component of claim 13, wherein the displacement device comprises a respective actuator coupled to each movable post.

15. The optical component of claim 14, wherein the actuators are linear actuators.

16. The optical component of claim 13, wherein:
the respective hydrostatic pressures in the wells are applied to respective fixed posts mounted to the respective locations on the reverse surface of the optical element and extending into the liquid metal in the respective wells; and
the change in hydrostatic pressure in a well changes a buoyant force applied by the liquid metal in the well to the respective fixed post.

17. The optical component of claim 16, wherein:
the base member has a first surface facing the reverse surface of the optical element and a second surface opposite the first surface;
the actuators are situated on the second surface; and
the movable posts extend from the actuators through the base member to the wells.

18. The optical component of claim 17, wherein the wells are situated on the first surface of the base member.

19. The optical component of claim 17, wherein the wells are situated on the reverse surface of the optical element.

20. The optical component of claim 2, wherein:
the base member has a first surface facing the reverse surface of the optical element; and
the wells are defined in the first surface.

21. The optical component of claim 2, wherein the wells are defined in the reverse surface of the optical element.

22. The optical component of claim 21, further comprising movable posts extending into the liquid metal in the respective wells.

23. The optical component of claim 22, wherein;
the displacement device comprises respective actuators coupled to the movable posts; and
the actuators are selectively actuatable to move the respective movable posts in the respective wells to produce respective hydrostatic pressures applied by the liquid metal to the respective locations.

24. The optical component of claim 23, wherein:
the base member has a first surface facing the reverse surface of the optical element and a second surface opposite the first surface;
the actuators are situated on the second surface; and
the movable posts extend from the respective actuators through the base member to the respective wells.

25. The optical component of claim 2, wherein the wells are located on a first surface of the base member facing the reverse surface of the optical element.

26. The optical component of claim 25, further comprising respective fixed posts coupled to the reverse surface of the optical element and extending into the liquid metal in the respective wells.

27. The optical component of claim 26, further comprising respective movable posts extending into the liquid metal in the respective wells.

28. The optical component of claim 27, wherein:
the displacement device comprises respective actuators coupled to the movable posts; and
the actuators are selectively actuatable to move the respective movable posts in the respective wells to produce respective hydrostatic pressures applied by the liquid metal to the fixed posts.

29. The optical component of claim 28, wherein the actuators are situated on a second surface, opposite the first surface, of the base member.

30. The optical component of claim 1, wherein the optical element is a mirror.

31. The optical component of claim 1, further comprising a frame to which the base member and optical element are coupled.

32. The optical component of claim 31, further comprising kinematic connectors mounting at least the optical element to the frame.

33. The optical component of claim 1, wherein the base member defines a coolant conduit that conducts a temperature-controlled coolant fluid.

34. The optical component of claim 1, wherein:
the displacement device comprises respective linear actuators coupled to respective movable posts; and
the linear actuators are selectively actuatable to move the respective movable posts in the respective wells to produce respective hydrostatic pressures applied by the liquid metal to the posts.

35. The optical component of claim 34, wherein the linear actuators are mounted to a second surface, opposite the first surface, of the base member.

36. The optical component of claim 1, wherein:
the optical element has an optical surface and a reverse surface;
the base member has a first surface and an opposing second surface, the first surface facing the reverse surface of the optical element; and
the wells are situated on the second surface.

37. The optical component of claim 36, wherein:
the displacement device comprises respective actuators coupled to respective movable posts extending into the liquid metal in respective wells; and
the actuators are selectively actuatable to move the respective movable posts in the respective wells to produce respective hydrostatic pressures applied by the liquid metal to the fixed posts.

38. The optical component of claim 1, wherein:
the displacement device comprises a movable transfer stylus configured selectively to hold and to release liquid metal for transport and release, respectively; and
liquid metal added or removed from a well changes the hydrostatic pressure applied by the liquid metal to the respective location.

39. The optical component of claim 38, wherein the transfer stylus is operable selectively:
to have a temperature below a freezing temperature of the liquid metal sufficiently to hold frozen liquid metal to the stylus; and
to have a temperature above a melting temperature of the liquid metal sufficiently to inhibit holding of liquid metal to the stylus.

40. The optical component of claim 1, further comprising:
a sensor-light source situated relative to the surface of the optical element;
a sensor situated relative to the source and to the surface of the optical element to receive sensor light, from that source, reflected from the surface; and
a controller connected to the sensor and to the displacement device, the controller being configured to actuate the at least one actuator, based on data from the sensor, to change hydrostatic pressure at at least one location.

41. An optical system, comprising:
a frame;
a base member mounted to the frame;
an optical element mounted to the frame and situated relative to the base member, the optical element having an optical surface and a reverse surface;
multiple wells corresponding to respective locations on the reverse surface;
liquid metal contained in the wells and coupled to the respective locations to apply respective hydrostatic pressures to the respective locations; and
at least one displacement device coupled to at least one well, the displacement device being configured to selectively change the respective hydrostatic pressure applied, relative to the base member, by the liquid metal in the well to the respective location.

42. The optical system of claim 41, wherein the base member and the optical element are mounted to the frame kinematically.

43. The optical system of claim 41, wherein the liquid metal in the wells is coupled to the respective locations by respective posts extending into respective wells.

44. The optical system of claim 43, wherein the posts are fixed posts mounted to the respective locations.

45. The optical system of claim 41, wherein:
the optical element includes a reverse surface; and
the wells are on the reverse surface.

46. The optical system of claim 41, wherein:
the base member has a first surface facing the reverse surface of the optical element; and
the wells are on the first surface.

47. The optical system of claim 46, further comprising respective fixed posts mounted to the respective locations and extending to liquid metal in respective wells on the first surface.

48. The optical system of claim 41, wherein each well comprises a respective displacement device.

49. The optical system of claim 48, wherein each displacement device comprises:
a movable post extending into the well; and
an actuator coupled to the movable post to move the post relative to liquid metal in the respective well to change hydrostatic pressure being applied to the respective location by the liquid metal in the respective well.

50. The optical system of claim 49, wherein:
the wells are located on the reverse surface of the optical element;
the actuators are mounted on the base member; and
the movable posts extend from the respective actuators on the base member to respective wells on the reverse surface.

51. The optical system of claim 49, wherein:
the wells are located on the base member;
the actuators are mounted on the base member; and
the movable posts extend from the respective actuators on the base member to respective wells on the base member.

52. The optical system of claim 51, further comprising respective fixed posts extending from the respective wells on the base member to the respective locations on the reverse surface of the optical element.

53. The optical system of claim 41, wherein the base member is actively cooled.

54. An optical system, comprising:
frame means for supporting at least one optical element of the system;
a base member mounted to the frame means;
an optical element mounted to the frame means relative to the base member and having an optical surface and a reverse surface;
multiple containment means for holding respective amounts of liquid metal, the containment means being situated on the base member or optical element and corresponding to respective locations on the surface;
coupling means for coupling the containment means to respective locations on the reverse surface such that a change in hydrostatic pressure in a particular containment means translates into a corresponding change in force applied to the respective location; and
actuation means for selectively changing hydrostatic pressure in the respective containment means to produce the corresponding change in force at a respective location on the reverse surface.

55. The optical system of claim 54, wherein the coupling means comprises fixed posts attached to the respective locations on the reverse surface and contacting the liquid metal in the respective containment means.

56. The optical system of claim 54, wherein the coupling means comprises respective movable posts at least contacting the liquid metal in the respective containment means.

57. The optical system of claim 56, wherein the movable posts are coupled to respective actuation means.

58. The optical system of claim 54, further comprising sensing means for sensing an optical parameter of the optical surface.

59. The optical system of claim 58, further comprising feedback-control means connecting the sensing means to the actuation means so as to selectively change hydrostatic pressure in the respective containment means to produce the corresponding change in force at the respective location on the reverse surface to produce a corresponding change in a respective location on the optical surface according to the feedback.

60. A method for providing an active-optics change of an optical surface of an optical element, comprising:
  providing multiple discrete contained volumes of liquid metal;
  coupling the contained volumes to respective locations on a reverse surface of the optical element to apply respective hydrostatic forces to the respective locations; and
  changing the respective hydrostatic force applied by at least one of the contained volumes to the respective location to produce a corresponding change in a region of the optical surface.

61. The method of claim 60, further comprising:
  monitoring performance of the optical surface; and
  changing the respective hydrostatic force applied by at least one of the contained volumes in response to the monitored performance to achieve a desired performance.

62. The method of claim 60, wherein coupling is achieved using fixed posts connecting the respective contained volumes to the respective locations.

63. The method of claim 60, wherein changing the respective hydrostatic forces comprises:
  providing each of the contained volumes with a movable post partially immersed in the liquid metal in the contained volume; and
  displacing one or movable posts as required to change the respective hydrostatic pressure.

64. The method of claim 63, wherein displacing comprises:
  connecting the movable post to a linear actuator; and
  energizing the linear actuator as required to move the movable post relative to the contained volume.

65. The method of claim 64, wherein the contained volumes are in the reverse surface of the optical element.

66. The method of claim 65, wherein the contained volumes are in a surface of a base member relative to which the hydrostatic pressures are applied.

67. The method of claim 60, further comprising controlling flow velocity of the liquid metal to attenuate a vibration in the optical element.

* * * * *